United States Patent
Alquier et al.

(10) Patent No.: US 10,472,230 B2
(45) Date of Patent: Nov. 12, 2019

(54) PROCESS FOR FABRICATING A MICROMECHANICAL STRUCTURE MADE OF SILICON CARBIDE INCLUDING AT LEAST ONE CAVITY

(71) Applicants: CENTRE NATIONAL DE LA RECHERCHE SCIENTIFIQUE (CNRS), Paris (FR); UNIVERSITÉ DE TOURS, Tours (FR)

(72) Inventors: Daniel Alquier, Tours (FR); Rami Khazaka, Antibes (FR); Jean François Michaud, Joue les Tours (FR); Marc Portail, Mougins (FR)

(73) Assignees: CENTRE NATIONAL DE LA RECHERCHE SCIENTIFIQUE (CNRS), Paris (FR); UNIVERSITÉ DE TOURS, Tours (FR)

( * ) Notice: Subject to any disclaimer, the term of this patent is extended or adjusted under 35 U.S.C. 154(b) by 0 days.

(21) Appl. No.: 16/091,384

(22) PCT Filed: Apr. 6, 2017

(86) PCT No.: PCT/EP2017/058222
§ 371 (c)(1),
(2) Date: Oct. 4, 2018

(87) PCT Pub. No.: WO2017/174709
PCT Pub. Date: Oct. 12, 2017

(65) Prior Publication Data
US 2019/0152772 A1    May 23, 2019

(30) Foreign Application Priority Data

Apr. 6, 2016  (FR) ...................................... 16 53006

(51) Int. Cl.
*B81C 1/00* (2006.01)
*B81B 3/00* (2006.01)

(52) U.S. Cl.
CPC ........ *B81C 1/00158* (2013.01); *B81B 3/0021* (2013.01); *B81C 1/00047* (2013.01);
(Continued)

(58) Field of Classification Search
None
See application file for complete search history.

(56) References Cited

U.S. PATENT DOCUMENTS

| 2004/0152228 A1 | 8/2004 | Benzel et al. |
| 2008/0227286 A1 | 9/2008 | Gaillard |

FOREIGN PATENT DOCUMENTS

EP    2 168 910 B1    1/2016

OTHER PUBLICATIONS

International Search Report as issued in International Patent Application No. PCT/EP2017/058222, dated May 11, 2017.
(Continued)

*Primary Examiner* — Zandra V Smith
*Assistant Examiner* — Lawrence C Tynes, Jr.
(74) *Attorney, Agent, or Firm* — Pillsbury Winthrop Shaw Pittman LLP

(57) ABSTRACT

A process for fabricating a micromechanical structure made of silicon carbide including a cavity, from a stack including a first silicon-carbide layer and a silicon layer on the first silicon-carbide layer, the process including shaping the silicon layer so as to form a discrete silicon structure on the first silicon-carbide layer. The process further includes, after the shaping of the silicon layer, a carbonization to initiate the removal of the discrete silicon structure; depositing a second
(Continued)

silicon-carbide layer; and an annealing step, the discrete silicon structure being entirely removed at the end of the annealing.

15 Claims, 9 Drawing Sheets

(52) U.S. Cl.
CPC .. *B81C 1/00476* (2013.01); *B81B 2201/0214* (2013.01); *B81B 2201/0264* (2013.01); *B81B 2203/0127* (2013.01); *B81B 2203/0315* (2013.01); *B81C 2201/0116* (2013.01)

(56) References Cited

OTHER PUBLICATIONS

Marsi, N., et al., "The Mechanical and Electrical Effects of MEMS Capacitive Pressure Sensor Based 3C—SiC for Extreme Temperature," Journal of Engineering, vol. 2014, Article ID 715167, < http://dx.doi.org/10.1155/2014/715167>, May 2014, 8 pages.

Young, D. J., et al., "High-Temperature Single-Crystal 3C—SiC Capacitive Pressure Sensor," IEEE Sensors Journal, vol. 4, No. 4, Aug. 2004, pp. 464-470.

Chung, G.-S., "Fabrication and Characterization of a Polycrystalline 3C—SiC Piezoresistive Micro-pressure Sensor," Journal of the Korean Physical Society, vol. 56, No. 6, Jun. 2010, pp. 1759-1762.

Cunning, B.-V., et al., Graphitized silicon carbide microbeams: wafer-level, self-aligned graphene on silicon wafers, Nanotechnology, vol. 25, (2014), 8 pages.

PROCESS FOR FABRICATING A MICROMECHANICAL STRUCTURE MADE OF SILICON CARBIDE INCLUDING AT LEAST ONE CAVITY

CROSS REFERENCE TO RELATED APPLICATIONS

This application is the U.S. National Stage of PCT/EP2017/058222, filed Apr. 6, 2017, which in turn claims priority to French Patent Application No. 1653006 filed Apr. 6, 2016, the entire contents of all applications are incorporated herein by reference in their entireties.

TECHNICAL FIELD OF THE INVENTION

The technical field of the invention is that of microfabrication. The present invention relates to a process for fabricating a micromechanical structure made of silicon carbide comprising at least one cavity.

TECHNOLOGICAL BACKGROUND OF THE INVENTION

Micromechanical structures, and in particular microelectromechanical systems, are employed in numerous technical fields and notably in the fabrication of sensors. These sensors are sometimes used in hostile environments, that is to say environments that have high temperatures or pressures, or extreme chemical conditions. For such applications, it is known to resort to microelectromechanical systems made of a resistant material such as silicon carbide (SiC). Indeed, this material has numerous advantages, notably its high mechanical strength and its inertia vis-à-vis most chemical agents.

Such sensors are known from the literature and described by N. Marsi et al. (The Mechanical and Electrical Effects of MEMS Capacitive Pressure Sensor Based 3C—SiC for Extreme Temperature, Journal of Engineering, Vol. 2014, Article ID 715167); D. J. Young et al. (High-Temperature Single-Crystal 3C—SiC Capacitive Pressure Sensor, IEEE Sensors Journal, Vol. 4, No 4, August 2004); G-S Chung (Fabrication and Characterization of a Polycrystalline 3C—SiC Piezoresistive Micro-pressure Sensor, Journal of the Korean Physical Society, Vol. 56, No 6, June 2010, pp 1759-1762); or instead by B. V. Cunning et al. (Graphitized silicon carbide microbeams: wafer-level, self-aligned graphene on silicon wafers, Nanotechnology, Vol. 25(32) p. 325301, 2014).

However, this chemical inertia has the consequence of making the production of micromechanical structures made of silicon carbide very difficult, because the agents normally used in conventional processes for fabricating microsystems are difficult to apply to silicon carbide. The document EP2168910B1 proposes a process in which a sacrificial silicon germanium (SiGe) structure is deposited and structured on a silicon carbide surface. This sacrificial structure is next covered by a silicon carbide layer. An opening is next arranged on the surface of the silicon carbide layer, this opening emerging on the sacrificial silicon germanium structure. A wet etching is next carried out, the etching agent penetrating via the opening arranged in the silicon carbide layer and attacking the sacrificial structure. Once the silicon germanium structure has been entirely etched, the opening arranged in the silicon carbide layer is closed again in order to obtain a cavity.

This process is not however without drawbacks. Firstly, in order to free the membrane, it is necessary to expose the sacrificial structure to the chemical etching agent, which imposes arranging an opening in the silicon carbide layer that next has to be closed again. In addition, the etching step necessitates a liquid chemical agent which may lead to a sticking effect of the silicon carbide structure induced by the surface tension of the etching agent or the rinsing agent making the micromechanical structure inoperable.

There thus exists a need for a process for fabricating a micromechanical structure made of silicon carbide comprising a cavity, for example a microelectromechanical system, not requiring arranging an opening in the silicon carbide layer to carry out the etching step and making it possible to prevent the phenomenon of adhesion of the membrane of the cavity during this etching step.

SUMMARY OF THE INVENTION

The invention offers a solution to the aforementioned problems by making it possible to remove the discrete silicon structure through a carbonisation step, a deposition step and an annealing step. It is thereby possible to do without the etching step. The drawbacks concerning the opening arranged in the silicon carbide layer and the sticking effect phenomenon associated therewith are thereby avoided.

To do so, a first aspect of the invention relates to a process for fabricating a micromechanical structure made of silicon carbide comprising a cavity, from a stack including a first silicon carbide layer and a silicon layer on the first silicon carbide layer, said process comprising a step of shaping the silicon layer so as to form a discrete silicon structure on the first silicon carbide layer.

In order to obtain the micromechanical structure, the process according to the invention also includes:
- a carbonisation step initiating the removal of the discrete silicon structure;
- a step of depositing a second silicon carbide layer;
- an annealing step;

the discrete silicon structure being entirely removed at the end of the annealing step.

Carbonisation step is taken to mean an annealing step in an atmosphere containing a carbon precursor, for example propane, but without silicon leading to the growth of a silicon carbide layer at the surface of the discrete silicon structure. This step is going to create empty spaces in the sacrificial silicon structures. These empty spaces will be called "voids" in the remainder of the text. In the process in question, a single discrete silicon structure is formed. However, it is also possible to form a plurality of discrete silicon structures making it possible to obtain a plurality of cavities. In the remainder of the text, the expression "a discrete structure" should thus be understood as "at least one discrete structure" and the expression "a cavity" should thus be understood as "at least one cavity".

In the process according to the invention, during the steps of carbonisation, depositing a second silicon carbide layer and annealing, a growth of silicon carbide takes place and leads to a migration of silicon atoms from the discrete silicon structure to the growth zones, that is to say to the surface of the discrete silicon structure. This diffusion has two consequences: its supplies the growth of the silicon carbide layer with silicon atoms at the surface of the discrete structure and it leads to the formation of a cavity in this same structure. A micromechanical structure is thus obtained made of silicon carbide comprising a cavity without resorting to an etching agent. In addition, given that no etching agent is used, it is no longer necessary to arrange an opening in the second silicon carbide layer and it is thus possible to obtain a hermetically sealed cavity without problem of sticking effect and sealing.

The step of shaping the silicon layer makes it possible to determine the geometry of the cavity and to control the size of the latter in three dimensions. Thus, unlike the prior art which describes the phenomenon of formation of voids as an undesirable phenomenon of which the geometric properties are dictated by the crystalline orientation of the silicon, the process according to the invention makes it possible to control this phenomenon in order to obtain a hermetically sealed cavity having dimensions that are perfectly controlled and independent of the crystalline orientation of the silicon layer.

More specifically, once the discrete silicon structure has been formed at the surface of the first silicon carbide layer, the formation of the cavity is ensured by the three final steps of the process. Firstly, the carbonisation step makes it possible to initiate the formation of voids and a silicon carbide layer on the surface of the discrete silicon structure. At the end of this first step, the size of the voids is less than one hundred nanometers. In order to ensure continuity of the membrane, the step of depositing a second silicon carbide layer is next carried out. This step is going to make it possible to fill a part of the openings created during the carbonisation step. This step is carried out such that, at the end of the deposition, openings enabling the diffusion of silicon atoms to the surface of the silicon carbide layer are still present in the silicon carbide layer. Finally, the annealing step makes it possible to consume the remaining carbon precursor and silicon so as to form a micromechanical structure made of silicon carbide comprising a sealed cavity.

Apart from the characteristics that have been mentioned in the preceding paragraph, the process for fabricating a micromechanical structure made of silicon carbide comprising a cavity according to one aspect of the invention may have one or more additional characteristics among the following, considered individually or according to all technically possible combinations thereof.

Advantageously, the step of shaping the silicon layer is directly followed by a second annealing step. This second annealing step makes it possible to improve the surface state of the discrete silicon structure before the carbonisation step and thereby to control the crystalline orientation of the silicon carbide membrane. It notably makes it possible to obtain a silicon carbide layer of which the crystalline orientation is of (111) type. This crystalline orientation makes it possible to obtain a low roughness compared to a membrane of which the crystalline orientation is of (110) type.

Advantageously, a thermal transition step is carried out between the carbonisation step and the step of depositing the second silicon carbide layer. During this thermal transition step, the temperature changes from a first temperature equal to the temperature of the carbonisation step to a second temperature equal to the temperature of the step of depositing the second silicon carbide layer.

Thus, during this step, the voids formed during the carbonisation step are going to grow to reach a size of the order of several hundreds of nanometers or even of the order of several micrometers.

Advantageously, a waiting step is carried out between the thermal transition step and the step of depositing the second silicon carbide layer. This waiting time makes it possible to modulate the size of the voids as a function of the desired size of the cavity.

Advantageously, the temperature during the annealing step is comprised between 1100° C. and 1400° C. This temperature window ensures a good compromise between the speed of growth of the voids and the silicon carbide layer and the quality of the silicon carbide obtained during this annealing step.

Advantageously, the duration of the annealing step is chosen as a function of the width, the length and/or the thickness of the discrete silicon structure. Thus, the silicon structure is entirely consumed at the end of the annealing step to form the micromechanical structure made of silicon carbide comprising a cavity.

Advantageously, the carbonisation step is carried out in an atmosphere comprising a hydrocarbon gas. Advantageously, propane is chosen as carbon precursor gas and hydrogen is chosen as carrier gas.

Advantageously, the stack includes a substrate and the process according to the invention includes, before the step of shaping the silicon layer:
  a step of depositing a first silicon carbide layer on the substrate;
  a step of depositing a silicon layer on the first silicon carbide layer.

The step of depositing a first silicon carbide layer and the step of depositing a silicon layer make it possible to obtain the stack including a first silicon carbide layer and a silicon layer on the first silicon carbide layer.

Advantageously, the substrate forming the first layer of the stack is chosen so as to enable the crystalline growth of 3C—SiC. This substrate may be a silicon (Si), sapphire ($Al_2O_3$), aluminium nitride (AlN), silicon carbide (SiC) or gallium nitride (GaN) substrate.

Advantageously, the first silicon carbide layer and/or the second silicon carbide layer have a 3C—SiC type crystalline structure. Preferably, the first silicon carbide layer has a (001) type crystalline orientation and/or the second silicon carbide layer has a (111) type crystalline orientation.

Advantageously, the shaping step is carried out so as to form in the silicon layer a plurality of linking elements, each linking element of the plurality of linking elements joining at least one first discrete structure of the plurality of discrete structures to a second discrete structure of the plurality of discrete structures.

Advantageously, for each linking element of the plurality of linking elements, the width of said linking element is less than the width of the discrete structures among the plurality of discrete structures that said linking element joins.

Width of a discrete structure is taken to mean the edge of smallest dimension of a section of said discrete structure obtained along a plane parallel to the surface of the first silicon carbide layer and passing through said discrete structure. In the same way, width of a linking element is taken to mean the edge of smallest dimension of a section of said linking element obtained along a plane parallel to the surface of the first silicon carbide layer and passing through said linking element.

Thus, a cavity is obtained in a silicon carbide structure comprising wide zones corresponding to the removed discrete silicon structures and zones of reduced width corresponding to the removed linking elements. Indeed, since the linking elements are produced in the same layer as the discrete structures, they are thus eliminated at the same time as the discrete silicon structures.

A second aspect of the invention relates to a microelectromechanical system type sensor including a micromechanical structure made of silicon carbide comprising a cavity sealed by a silicon carbide membrane, obtained by a process according to a first aspect of the invention.

Advantageously, the sensor is a piezoresistive type or capacitive type pressure sensor.

Advantageously, the sensor is a chemical sensor including at least one layer sensitive to a chemical compound to detect, said sensitive layer being deposited on said membrane.

A third aspect of the invention relates to the use of a sensor according to a second aspect of the invention in or on an organic tissue.

A fourth aspect of the invention relates to the use of a sensor according to a second aspect of the invention in a radiative environment.

BRIEF DESCRIPTION OF THE FIGURES

Other characteristics and advantages of the invention will become clear on reading the detailed description that follows, with reference to the appended figures, which illustrate.

DETAILED DESCRIPTION

Figure 1:
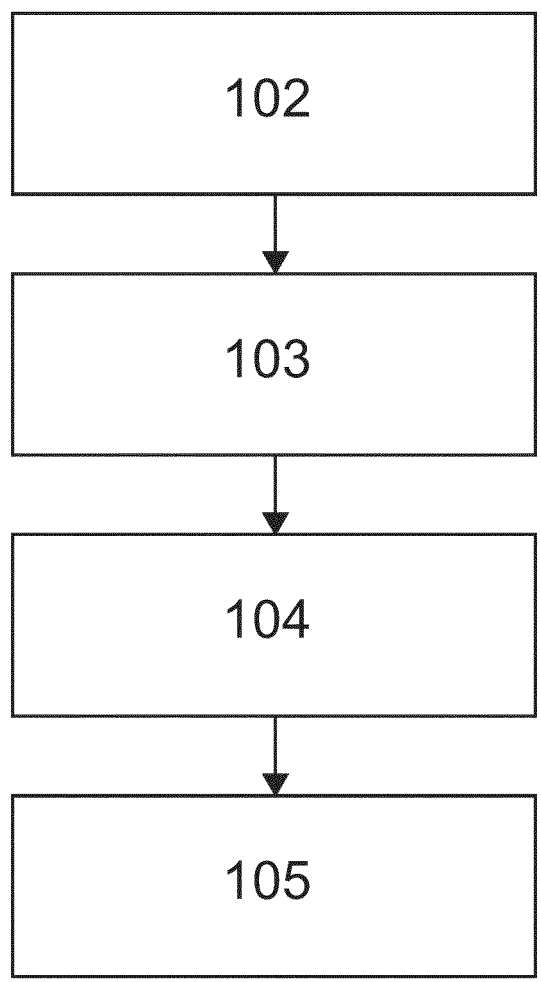
FIG. 1, a flow chart of the process according to a first embodiment of the invention.
Figure 2A:
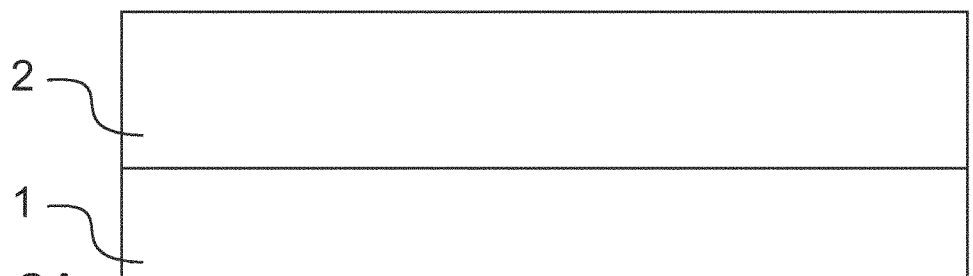
FIGS. 2A to 2F, a diagram of the different steps of the process according to a second embodiment.
Figure 2B:
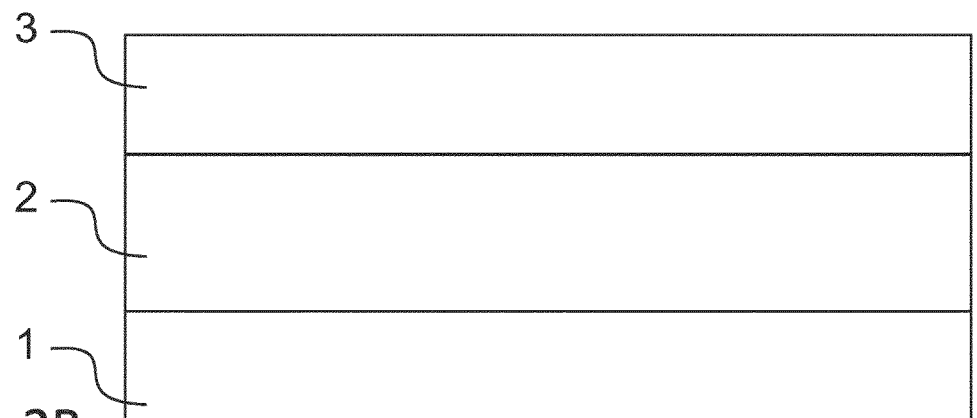
Figure 2C:
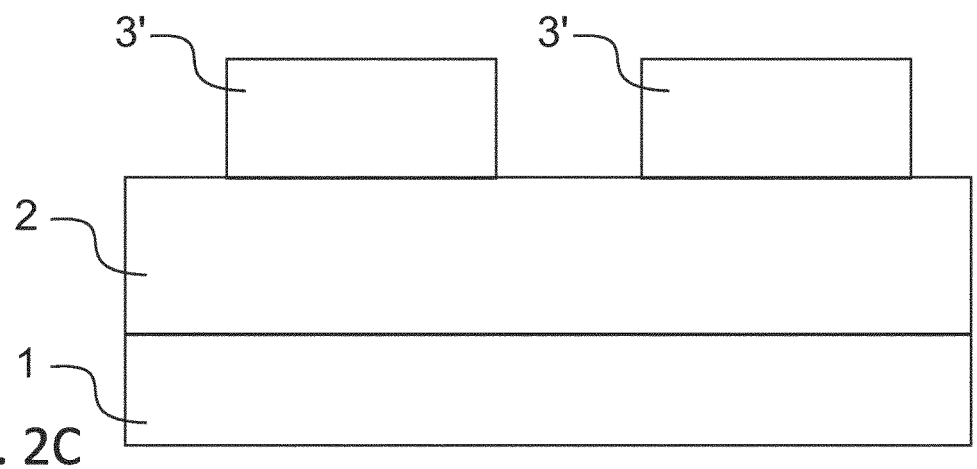
Figure 2D:
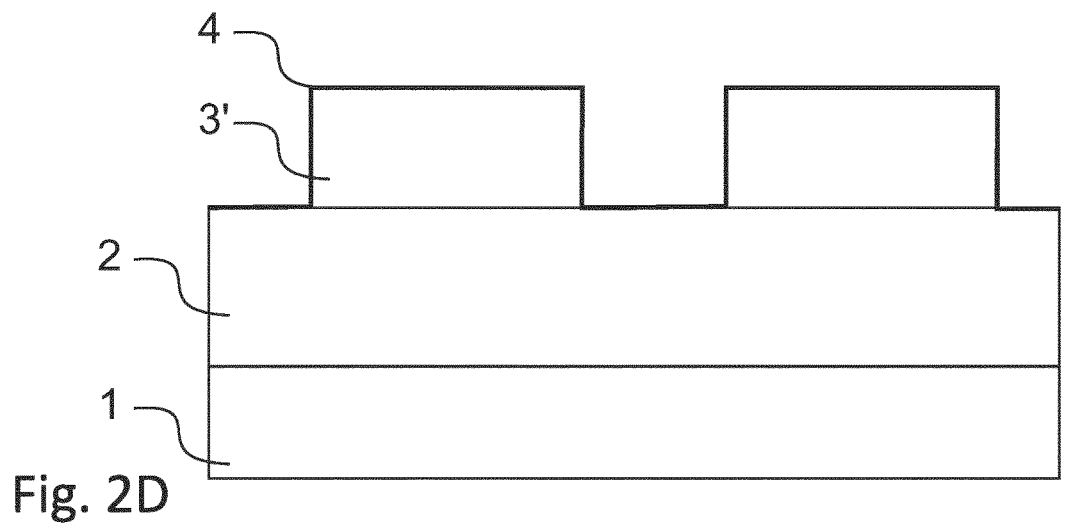
Figure 2E:
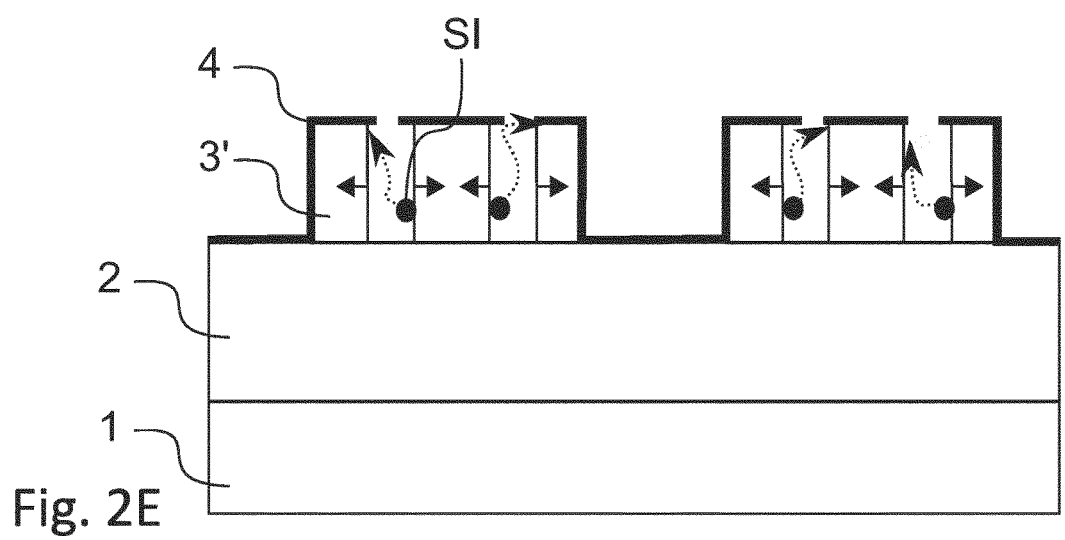
Figure 2F:
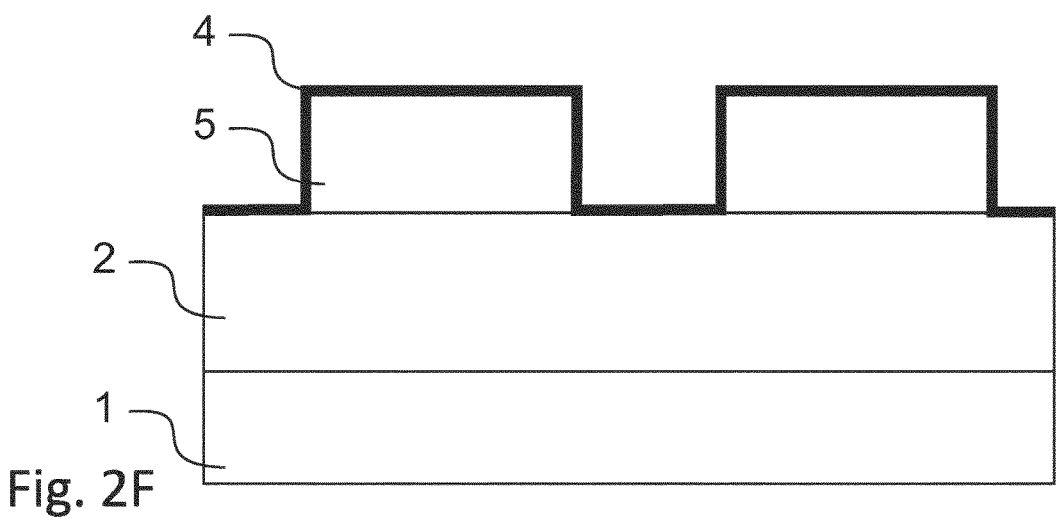

One aspect of the invention illustrated in FIG. 1 and in FIGS. 2A to 2F relates to a process for fabricating a micromechanical structure made of silicon carbide comprising a cavity 5, from a stack including a first silicon carbide layer 2 and a silicon layer 3 on the first silicon carbide layer 2, said process comprising a step 102 of shaping the silicon layer 3 (FIG. 2C) so as to form a discrete silicon structure 3' on the first silicon carbide layer 2.

In order to obtain a micromechanical structure made of silicon carbide comprising a cavity 5, the process further includes:
 a carbonisation step 103 initiating the removal of the discrete silicon structure 3';
 a step 104 of depositing a second silicon carbide layer 4;
 an annealing step 105.
the discrete silicon structure being entirely removed at the end of the annealing step.

As explained previously, carbonisation is taken to mean an annealing step in an atmosphere containing a carbon precursor, for example propane, but without silicon leading to the growth of a silicon carbide layer at the surface of the discrete silicon structure as well as the formation of voids in these same structures.

The growth of silicon carbide during the carbonisation step 103, the step 104 of depositing a second silicon carbide layer 4 and during the annealing step 105 leads to the formation of a silicon carbide layer on the surface of the discrete structure (FIG. 2D) as well as a migration of silicon Si atoms (illustrated by dotted arrows in FIG. 2E) from the discrete silicon structure 3' to the growth zones, that is to say to the surface of the discrete silicon structure 3'. This diffusion has two consequences: it supplies the growth of the silicon carbide layer 4 with silicon atoms at the surface of the discrete structure 3' and it leads to the formation of a cavity 5 (illustrated by continuous arrows in FIG. 2E) in these same structures 3'. A micromechanical structure made of silicon carbide comprising a cavity 5 is thus obtained without having to resort to an etching agent. In addition, given that no etching agent is used, it is no longer necessary to arrange an opening in the silicon carbide layer 4 and a hermetically sealed cavity 5 may thus be obtained.

More specifically, the carbonisation step 103 makes it possible to initiate the formation of voids. At the end of this first step, the size of the voids is in general less than one hundred nanometers. In order to ensure continuity of the membrane, the step 104 of depositing a second silicon carbide layer 4 is next carried out. This step is going to make it possible to fill a part of the openings created during the carbonisation step 103. The latter is carried out such that, at the end of the step 104 of depositing the second silicon carbide layer 4, openings enabling the diffusion of silicon atoms to the surface of the silicon carbide layer 4 are still present in the silicon carbide layer 4. During these first two steps, the 3C—SiC layer continues to form and thicken. Finally, the annealing step 104 makes it possible to consume the remaining carbon precursor and silicon so as to form a micromechanical structure made of silicon carbide comprising a sealed cavity 5.

In other words, a micromechanical structure made of silicon carbide comprising a cavity 5 is formed by the consumption of the silicon atoms of the discrete structure 3', this consumption leading to the formation of the silicon carbide layer 4 forming a silicon carbide membrane. The cavity 5 is thus self-sealed and the pressure within this cavity 5 is identical to the pressure used during the annealing step 105.

In one embodiment, the silicon carbide composing the second silicon carbide layer 4 has a 3C—SiC type crystalline structure.

Figure 3:
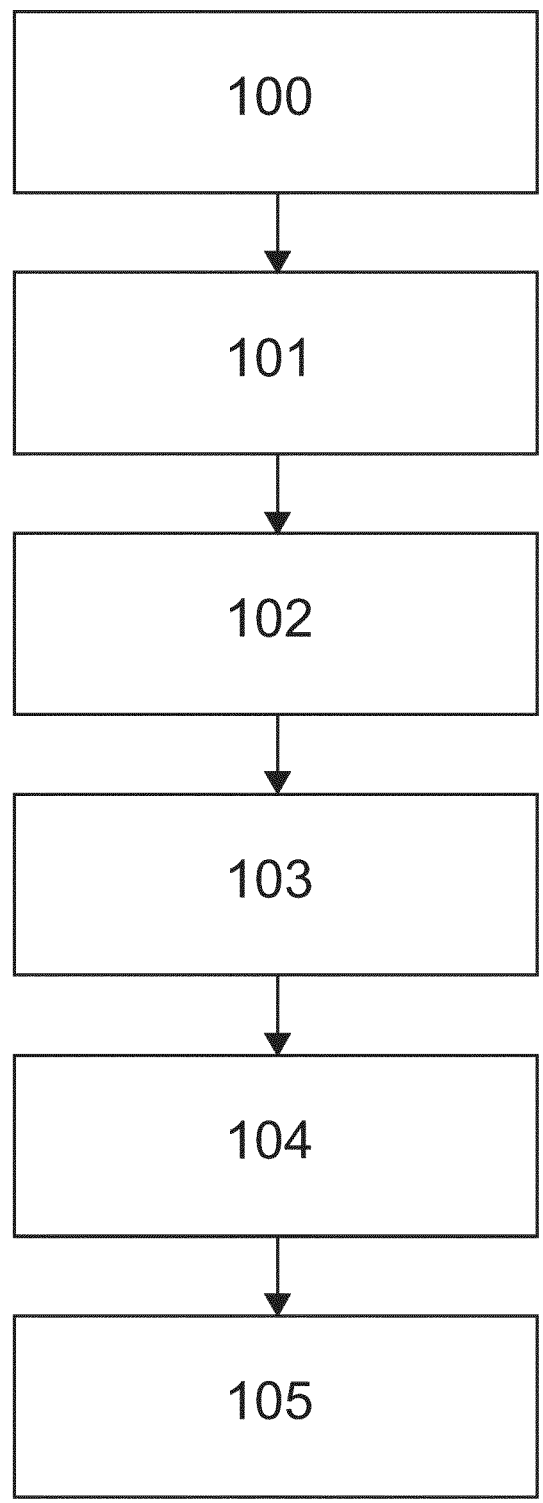
FIG. 3, a flow chart of the process according to a third embodiment of the invention.

In one embodiment illustrated in FIG. 3, the stack further includes a substrate 1. The process then includes, before the step 102 of shaping the silicon layer 3:
 a step 100 of depositing (FIG. 2A) a first silicon carbide layer 2 on the substrate 1;
 a step 101 of depositing (FIG. 2B) a silicon layer 3 on the first silicon carbide layer 2.

The step 100 of depositing a first silicon carbide layer 2 and the step 101 of depositing a silicon layer 3 make it possible to obtain the stack including a first silicon carbide layer 2 and a silicon layer 3 on the first silicon carbide layer 2.

The substrate 1 of the stack is chosen so as to enable the growth of silicon carbide. It may be selected from a silicon (Si), sapphire ($Al_2O_3$), aluminium nitride (AlN), silicon carbide (SiC) or gallium nitride (GaN) substrate. Indeed, these substrates make it possible to grow, during the step 100 of depositing the first silicon carbide layer 2, a monocrystalline silicon carbide layer and thereby improve the mechanical and electrical characteristics of the micromechanical structure obtained. In one embodiment, the first silicon carbide layer 2 is of 3C—SiC type. In one embodiment, the crystalline orientation of the first silicon carbide layer 2 is of (001) type. However, certain growth conditions may lead to a first polycrystalline or even amorphous silicon carbide layer 2 being obtained.

In one embodiment, the step of depositing 100 the first silicon carbide layer 2 on the substrate 1 may be preceded by a step of removing the native oxide present on the surface of said substrate 1. When the substrate 1 is a silicon substrate, this step of removing native oxide may take the form of a homoepitaxy of a thin silicon layer on the silicon substrate 1 or an annealing under hydrogen atmosphere. If the substrate 1 is a nitride, this step of removing native oxide may take the form of an annealing under nitrogen atmosphere.

In one embodiment, the step of depositing 100 the first silicon carbide layer 2 may be carried out by an epitaxy process, for example using a chemical vapour deposition (CVD) technique. In one embodiment, the thickness of the first silicon carbide layer 2 is comprised between 100 nm and 20 µm, preferably equal to 5 µm.

The step 102 of shaping (FIG. 2C) the silicon layer 3 may be carried out using a conventional lithography technique. For example, the etching of the silicon layer may be carried out using an inductively coupled plasma (ICP) etching in an atmosphere containing sulphur hexafluoride ($SF_6$), ethylene ($C_2H_4$) and argon (Ar). In another example, it could be possible to resort to wet etching. The removal of the resin layer after etching may be carried out by an oxygen plasma step. This oxygen plasma cleaning step may be potentially followed by a cleaning step using a piranha solution.

Figure 4:
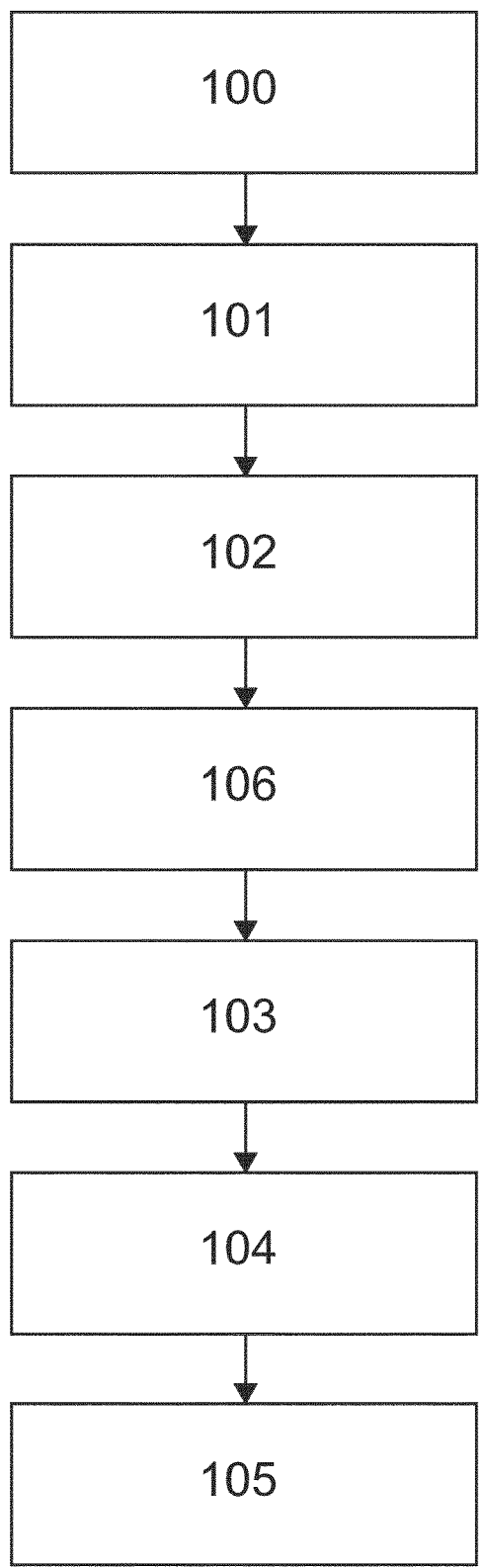
FIG. 4, a flow chart of the process according to a fourth embodiment of the invention.

In one embodiment illustrated in FIG. 4, the step 102 of shaping (FIG. 2C) the silicon layer 3 is followed by a second annealing step 106. During this annealing step, the temperature may be comprised between 800° C. and 1000° C. The pressure during this annealing step 106 may be chosen less than 1 bar. The duration of this annealing step 106 may be substantially equal to 10 minutes or even 20 minutes. It makes it possible to obtain a better surface state before the carbonisation step 103 and thereby to control the crystalline orientation of the second silicon carbide layer 4. In one embodiment, the second silicon carbide layer 4 has a (111) type crystalline orientation.

In one embodiment, the temperature during the carbonisation step 103 is comprised between 860° C. and 1300° C., preferably between 860° C. and 1150° C. In a first alternative, the temperature is modified so as to pass from a minimum temperature of 860° C. to a maximum temperature of 1150° C. In a second alternative, the temperature is modified so as to pass from a minimum temperature of 860° C. to a maximum temperature of 1100° C. In a preferential manner, the carbonisation step 103 is carried out under an atmosphere comprising a carbon precursor, for example propane, and hydrogen.

Figure 5:
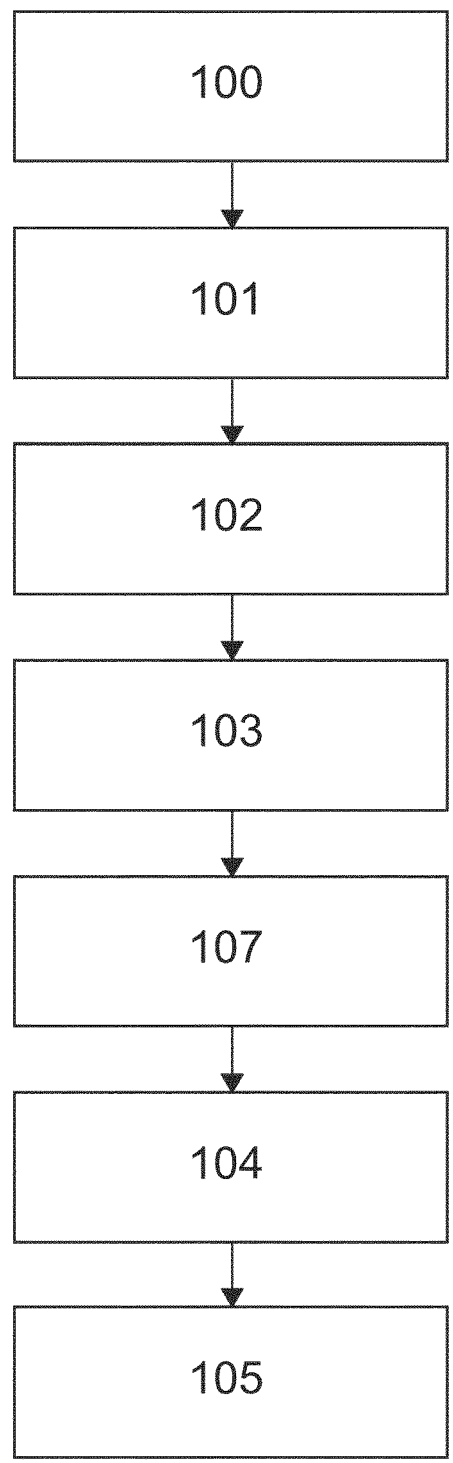
FIG. 5, a flow chart of the process according to a fifth embodiment of the invention.

In one embodiment illustrated in FIG. 5, when the temperature between the carbonisation step 103 and the step 104 of depositing the second silicon carbide layer 4 is different, a thermal transition step 107 is carried out between the carbonisation step 103 and the step 104 of depositing the second silicon carbide layer 4. During this thermal transition step 107, the temperature is modified from a first value equal to the temperature of the carbonisation step 103 to a second value equal to the temperature of the step 104 of depositing the second silicon carbide layer 4. During this thermal transition step 107, the voids formed during the carbonisation step 103 are going to grow to reach a size of the order of several hundreds of nanometers or even of the order of a micrometer. For example, for a thickness of the discrete silicon structure of 300 nm, a carbonisation step 103 carried out at 1150° C. and a step 103 of depositing the second silicon carbide layer 4 carried out at 1320° C., at the end of the thermal transition step 107, the size of the voids is comprised between 500 nm and 1 µm. This thermal transition step 107 may be carried out under an atmosphere comprising hydrogen.

Figure 6:
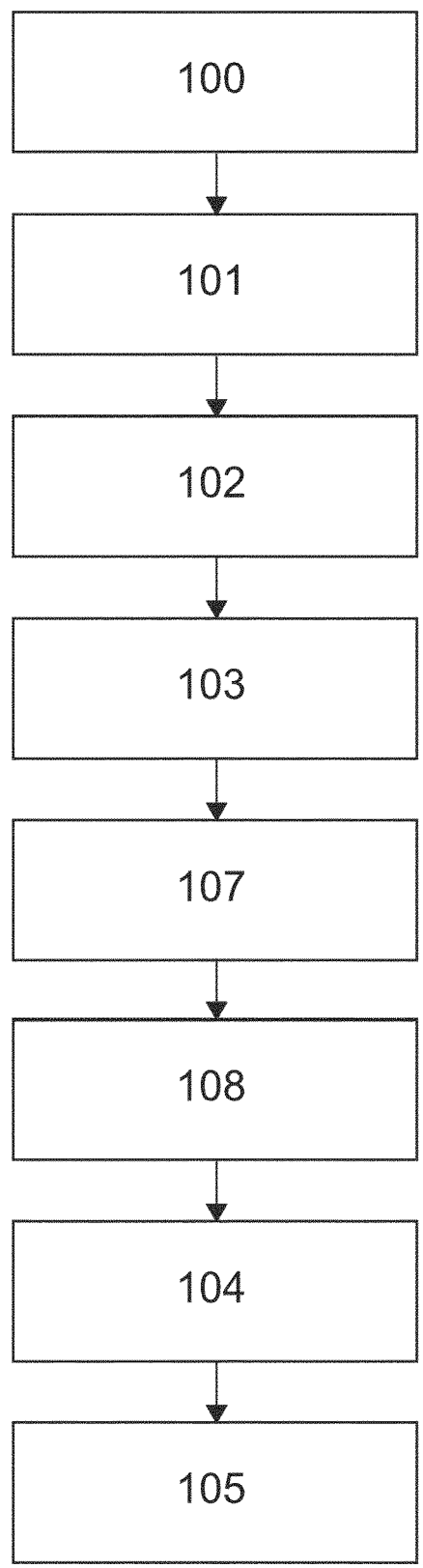
FIG. 6, a flow chart of the process according to a sixth embodiment of the invention.

In one embodiment illustrated in FIG. 6, a waiting step 108 is carried out between the thermal transition step 107 and the step 104 of depositing the second silicon carbide layer 4. This waiting step 108 makes it possible to make the voids grow before the step 104 of depositing the second silicon carbide layer 4. The size of the voids at the end of the waiting step 108 depends on the duration of this waiting step 108. For example, for a thickness of the discrete silicon structure 3' of 300 nm, a carbonisation step 103 carried out at 1150° C. and a step 104 of depositing the second silicon carbide layer 4 carried out at 1320° C., the size of the voids obtained at the end of a waiting step 108 of 5 minutes is comprised between 1.5 µm and 2.5 µm. In a second example, for a thickness of the discrete silicon structure of 300 nm, a carbonisation step 103 carried out at 1150° C. and a step 104 of depositing the second silicon carbide layer 4 carried out at 1320° C., the size of the voids obtained at the end of a waiting step 108 of 10 minutes is comprised between 3.5 µm and 5 µm.

The size of the voids is also dependent on the thickness of the discrete structure 3'. For example, for a thickness of the discrete silicon structure of 100 nm, a carbonisation step 103 carried out at 1150° C. and a step 104 of depositing the second silicon carbide layer 4 carried out at 1320° C., the size of the voids obtained at the end of a waiting step 108 of 5 minutes is at least equal to 5 µm.

In a second example, for a thickness of the discrete silicon structure of 500 nm, a carbonisation step 103 carried out at 1150° C. and a step 104 of depositing the second silicon carbide layer 4 carried out at 1320° C., the size of the voids obtained at the end of a waiting step 108 of 5 minutes is equal to 900 nm. In a third example, for a thickness of the discrete silicon structure of 1.2 µm, a carbonisation step 103 carried out at 1150° C. and a step 104 of depositing the second silicon carbide layer 4 carried out at 1320° C., the size of the voids obtained at the end of a waiting step 108 of 5 minutes is equal to 400 nm. In one embodiment, the temperature during the step 104 of depositing the second silicon carbide layer 4 is comprised between 1100° C. and 1400° C. This deposition step 104 may be carried out by epitaxy using a silicon precursor, for example silane ($SiH_4$) and a carbon precursor, for example propane ($C_3H_8$). This deposition may be carried out by a chemical vapour deposition (CVD) technique. The duration of this step may be comprised between 30 seconds and 10 minutes, preferably between 1 minute and 3 minutes.

In one embodiment, the temperature during the annealing step 105 is equal to the temperature during the step of depositing 104 the second silicon carbide layer 4, that is to say comprised between 1100° C. and 1400° C. The duration of the annealing step 105 is a function of the size of the discrete silicon structure 3'.

For example, if the discrete structure 3' has a thickness of 200 nm, a width of 20 µm and a length of 20 µm, then the annealing step 105 has a duration substantially equal (to more or less 20%) to 30 minutes.

Figure 7A:
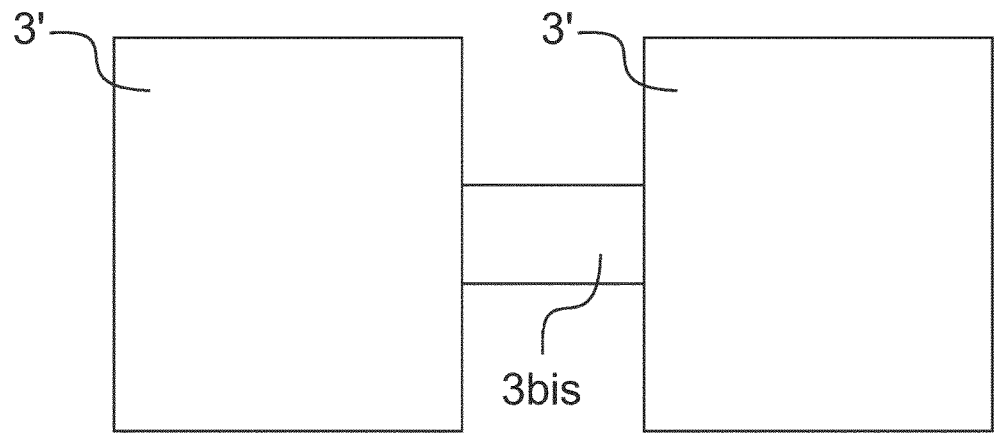
FIGS. 7A and 7B, an illustration of the structure obtained at the end of the step of shaping the silicon layer according to one embodiment of the invention.

In one embodiment illustrated in FIG. 7A, the shaping step 102 is carried out so as to form in the silicon layer 3 a plurality of linking elements, each linking element 3bis of the plurality of linking elements joining at least one first discrete structure 3' of the plurality of discrete structures to a second discrete structure 3' of the plurality of discrete structures.

Preferably, for each linking element 3bis of the plurality of linking elements, the width of said linking element 3bis is less than the width of the discrete structures 3' among the plurality of discrete structures that said linking element 3bis joins. Each linking element has in addition a length equal to the distance separating the discrete structures 3' among the plurality of discrete structures that said linking element 3bis joins.

Figure 7B:
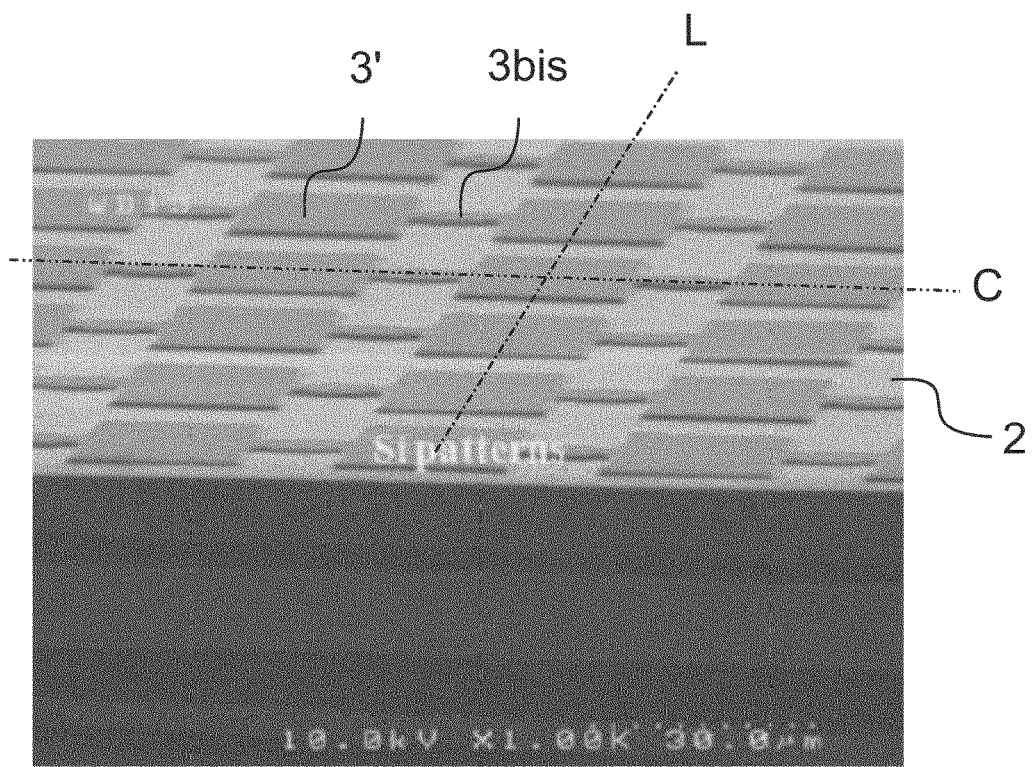

In one embodiment illustrated in FIG. 7B, the discrete structures 3' are spread out on the surface of the first silicon carbide layer 2 in the form of a matrix of discrete structures 3', said discrete structures forming a plurality of lines L and a plurality of columns C, each including a plurality of discrete structures 3'. In this embodiment, each discrete structure 3' of a same column C is joined by means of a linking element 3bis to the discrete structure 3' that precedes it in the column C so as to obtain a continuous structure formed by an alternation of discrete structures 3' and linking elements 3bis.

In one embodiment, the discrete structures have a square shape of a width of 25 µm and the linking elements have a width of 5 µm and a length of 10 µm. In other words, in this embodiment, two consecutive discrete structures 3' joined by a linking element 3bis are thus spaced apart by a distance of 10 µm. Since the discrete silicon structures 3' and the linking elements 3bis are produced in the same silicon layer 3, they thus have an identical thickness equal to the thickness of said silicon layer 3. This thickness may for example be equal to 200 nm. The steps carried out on the discrete silicon structures 3', notably the carbonisation step 103, the step of depositing silicon carbide 104 and the annealing step 105, are also implemented on the linking elements 3bis. A cavity 5 is thus obtained in a structure made of silicon carbide comprising zones having a width of 25 µm corresponding to the removed discrete silicon structures 3' and zones having a width of 5 µm and a length of 10 µm corresponding to the linking elements 3bis removed by the process that is the subject matter of the invention. Indeed, since the linking elements 3bis are produced in the same silicon layer 3 as the discrete silicon structures 3', they are thus eliminated in a concomitant manner with the discrete silicon structures.

A particularly advantageous application of these micromechanical structures 5 relates to the production of sensors, notably sensors used in severe media, involving extreme pressure and/or temperature conditions as well as in demanding chemical environments. Such sensors, in particular "MEMS" or microelectromechanical system sensors, advantageously benefit from the mechanical and electrical properties of SiC, notably its properties of thermal conductivity, mechanical strength and its stability towards most chemical compounds, even at temperatures exceeding 300° C., make SiC particularly suited to this type of application.

Figure 8:
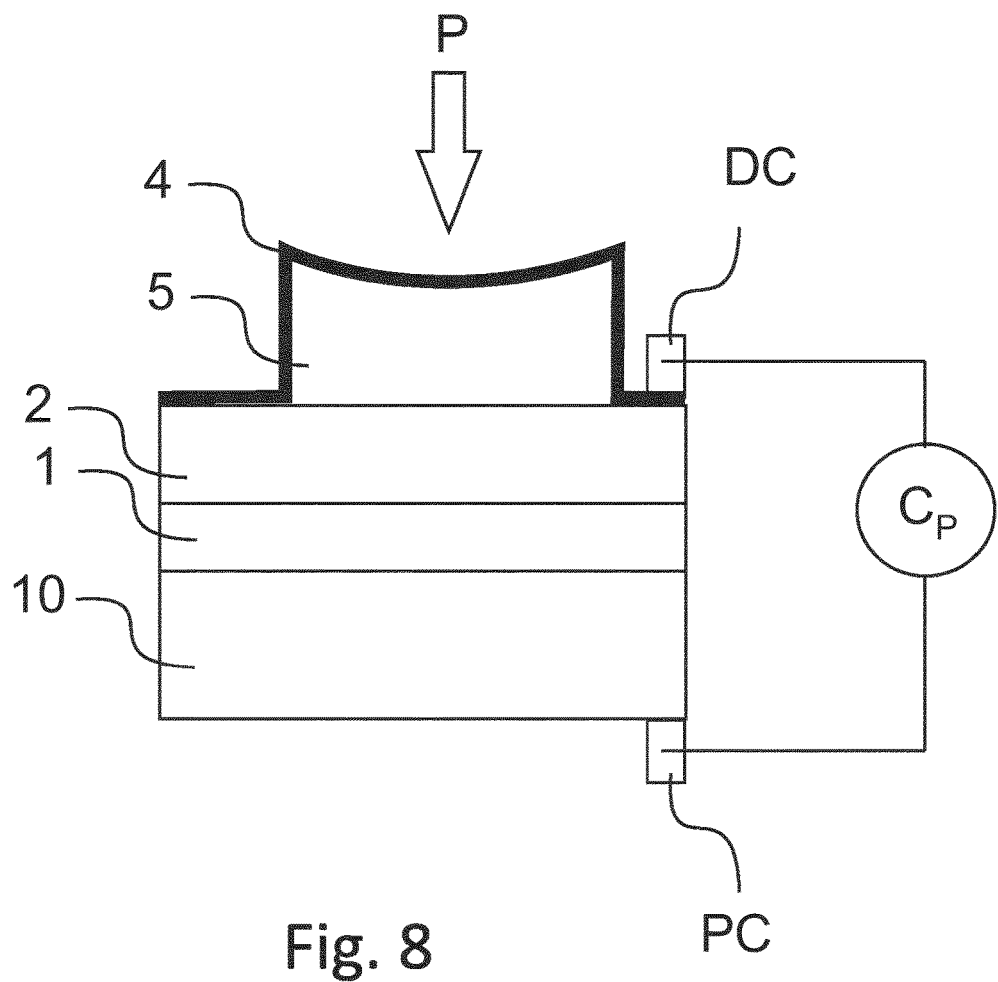
FIG. 8, an embodiment of a sensor according to a second aspect of the invention.

MEMS sensors are, for example, capacitive type pressure sensors. In one embodiment illustrated in FIG. 8, the sensor according to a second aspect of the invention comprises a support 10, for example a silicon support, separated from the micromechanical structure by an electrically insulating layer 1, for example an aluminium nitride (AlN) layer 1. Under the effect of a pressure P, the membrane 4 undergoes an elastic deformation modifying the distance between the membrane 4 and the support 10. This variation in distance results in a proportional variation of the capacitance Cp. This variation may be measured, for example through a first contact PC arranged on the support and a second contact DC arranged on the membrane 4, and the pressure P exerted on the SiC membrane may be deduced from this measurement.

MEMS sensors may also be piezoresistive type pressure sensors. In one embodiment (not illustrated), a piezoresistive sensor according to a second aspect of the invention comprises at least two contacts deposited on the SiC membrane 4 of the micromechanical structure. Under the effect of a pressure, a variation in the resistivity of the SiC membrane proportional to the pressure applied is measured and makes it possible to deduce therefrom the pressure exerted on the SiC membrane.

In another embodiment of a sensor according to a second aspect of the invention, the sensor is a chemical sensor. Such a chemical sensor may, for example, be obtained by depositing, on the silicon carbide membrane 4 of the cavity of the micromechanical structure obtained by a process according to a first aspect of the invention, at least one layer sensitive to a chemical compound to detect, notably graphene or metal oxide, for example a layer of $SiO_2$, $TiO_2$, ZnO, $SnO_2$.

The use of the properties of a membrane such as that obtained using a process according to a first aspect of the invention for detection purposes is a practice well known to those skilled in the art. The configurations that have been described serve above all to illustrate, through several examples, the advantages that result from the use of a micromechanical structure obtained using a process according to a first aspect of the invention and the implementation of such a structure in a sensor according to a second aspect of the invention.

The invention claimed is:

1. A process for fabricating a micromechanical structure made of silicon carbide comprising a cavity, from a stack including a first silicon carbide layer and a silicon layer on the first silicon carbide layer, said process comprising:
   a step of shaping the silicon layer so as to form a discrete silicon structure on the first silicon carbide layer, and after the step of shaping the silicon layer:
      a carbonization step initiating the removal of the discrete silicon structure;
      a step of depositing a second silicon carbide layer;
      an annealing step;
   the discrete silicon structure being entirely removed at the end of the annealing step.

2. The process according to claim 1, wherein the step of shaping the silicon layer is directly followed by a second annealing step.

3. The process according to claim 1, further comprising a thermal transition step between the carbonization step and the step of depositing the second silicon carbide layer during which the temperature changes from a first temperature equal to the temperature of the carbonization step to a second temperature equal to the temperature of the step of depositing the second silicon carbide layer.

4. The process according to claim 3, further comprising a waiting step between the thermal transition step and the step of depositing the second silicon carbide layer.

5. The process according to claim 1, wherein the temperature during the step of depositing the second silicon carbide layer and/or the annealing step is comprised between 1100° C. and 1400° C.

6. The process according to claim 1 wherein the duration of the annealing step is chosen as a function of the width, the length and/or the thickness of the discrete silicon structure.

7. The process according to claim 1, wherein the carbonization step is carried out under an atmosphere comprising a hydrocarbon gas.

8. The process according to claim 1, wherein the stack further includes a substrate; said process including, before the step of shaping the silicon layer:
- a step of depositing a first silicon carbide layer on the substrate;
- a step of depositing a silicon layer on the first silicon carbide layer;
- the step of depositing a first silicon carbide layer and the step of depositing a silicon layer making it possible to obtain the stack including a first silicon carbide layer and a silicon layer on the first silicon carbide layer.

9. The process according to claim 8, wherein the substrate forming the first layer of the stack is selected from a silicon, sapphire, aluminium nitride, silicon carbide or gallium nitride substrate.

10. The process according to claim 1, wherein the shaping step is carried out so as to form in the silicon layer a plurality of linking elements and a plurality of discrete structures, each linking element of the plurality of linking elements joining at least one first discrete structure of the plurality of discrete structures to a second discrete structure of the plurality of discrete structures.

11. A microelectromechanical system sensor including a micromechanical structure made of silicon carbide comprising a cavity sealed by a silicon carbide membrane obtained using a process according to claim 1.

12. The sensor according to claim 11, wherein said sensor is a piezoresistive or capacitive pressure sensor.

13. The sensor according to claim 11, wherein said sensor is a chemical sensor including at least one layer sensitive to a chemical compound to detect, said sensitive layer being deposited on said membrane.

14. A method comprising providing a sensor, as defined in claim 11 in or on an organic tissue.

15. A method comprising providing a sensor, as defined in claim 11 in a radiative environment.

* * * * *